(12) United States Patent
Jin et al.

(10) Patent No.: US 9,807,918 B2
(45) Date of Patent: Oct. 31, 2017

(54) ELECTRONIC DEVICE AND SHIELDING MEMBER PRODUCTION METHOD

(71) Applicant: Huawei Device Co., Ltd., Shenzhen (CN)

(72) Inventors: Linfang Jin, Shenzhen (CN); Jie Zou, Shenzhen (CN); Hao Sun, Shenzhen (CN); Mingxing Yang, Shenzhen (CN)

(73) Assignee: HUAWEI DEVICE CO., LTD., Shenzhen (CN)

( * ) Notice: Subject to any disclaimer, the term of this patent is extended or adjusted under 35 U.S.C. 154(b) by 219 days.

(21) Appl. No.: 14/791,726

(22) Filed: Jul. 6, 2015

(65) Prior Publication Data

US 2015/0313045 A1 Oct. 29, 2015

Related U.S. Application Data

(63) Continuation of application No. PCT/CN2014/073401, filed on Mar. 13, 2014.

(51) Int. Cl.
*H05K 9/00* (2006.01)
*B29C 45/14* (2006.01)
(Continued)

(52) U.S. Cl.
CPC ..... *H05K 9/0049* (2013.01); *B29C 45/14639* (2013.01); *G06F 1/1656* (2013.01);
(Continued)

(58) Field of Classification Search
CPC ...... H05K 3/284; H05K 7/142; H05K 7/1418; H05K 9/0032; H05K 9/0039; H05K 9/0016; G06F 1/182; G06F 1/184
(Continued)

(56) References Cited

U.S. PATENT DOCUMENTS 4,717,990 A * 1/1988 Tugcu ............ H05K 9/0037
174/384
5,574,628 A * 11/1996 Persia ............ H05K 5/0269
257/679
(Continued)

FOREIGN PATENT DOCUMENTS

CN 1656865 A 8/2005
CN 1707698 A 12/2005
(Continued)

OTHER PUBLICATIONS

Foreign Communication From a Counterpart Application, Chinese Application No. 2016-506762, Chinese Office Action dated Jul. 5, 2016, 4 pages.
(Continued)

*Primary Examiner* — Tuan T Dinh
(74) *Attorney, Agent, or Firm* — Conley Rose, P.C.

(57) ABSTRACT

An electronic device and related method that includes a metal member, a circuit board, and a shielding member. A through hole or slot is disposed on the metal member. The shielding member is fastened on the metal member. The shielding member includes a blocking portion and an enclosing portion. The blocking portion is made of an electrically conductive plastic material. The enclosing portion is made of a metal material or an electrically conductive plastic material. The blocking portion is configured to block the through hole or slot. The enclosing portion is disposed around the electronic component. One end of the enclosing portion is electrically connected to the metal member, and the other end of the enclosing portion is electrically connected to the circuit board. The metal member, the blocking portion, the enclosing portion, and the circuit board form a shielding space, and the electronic component is located in the shielding space.

13 Claims, 4 Drawing Sheets

(51) Int. Cl.
*G06F 1/16* (2006.01)
*G06F 1/18* (2006.01)
*B29L 31/34* (2006.01)

(52) U.S. Cl.
CPC .......... *G06F 1/182* (2013.01); *H05K 9/0022* (2013.01); *H05K 9/0081* (2013.01); *B29K 2995/0005* (2013.01); *B29L 2031/3481* (2013.01)

(58) Field of Classification Search
USPC .......... 361/752–759, 816, 818, 748; 174/51, 174/350–358
See application file for complete search history.

(56) References Cited

U.S. PATENT DOCUMENTS

| | | | | |
|---|---|---|---|---|
| 6,243,274 | B1* | 6/2001 | Willis | H05K 9/0022 174/378 |
| 6,898,077 | B2* | 5/2005 | Henson | H05K 5/0208 361/679.33 |
| 6,930,891 | B1* | 8/2005 | Hama | H05K 9/0026 174/359 |
| 7,518,880 | B1 | 4/2009 | Ziberna | |
| 2003/0062179 | A1 | 4/2003 | West | |
| 2006/0084289 | A1 | 4/2006 | Ziberna | |
| 2006/0221591 | A1 | 10/2006 | Kong | |
| 2008/0144874 | A1 | 6/2008 | Wu et al. | |
| 2010/0257732 | A1 | 10/2010 | Ziberna | |

FOREIGN PATENT DOCUMENTS

| | | |
|---|---|---|
| CN | 2862614 Y | 1/2007 |
| CN | 101052286 A | 10/2007 |
| CN | 101652057 A | 2/2010 |
| CN | 201766809 U | 3/2011 |
| CN | 202634996 U | 12/2012 |
| EP | 1130673 A1 | 9/2001 |
| JP | 1197874 A | 4/1999 |
| JP | 2001244127 A | 9/2001 |
| JP | 2008084964 A | 4/2008 |
| JP | 2009218432 A | 9/2009 |
| WO | 2007094068 A1 | 8/2007 |
| WO | 2009147540 A2 | 12/2009 |

OTHER PUBLICATIONS

Foreign Communication From a Counterpart Application, Chinese Application No. 2016-506762, English Translation of Chinese Office Action dated Jul. 5, 2016, 5 pages.
Partial English Translation and Abstract of Japanese Patent Application No. JPH11-97874, Aug. 12, 2016, 12 pages.
Partial English Translation and Abstract of Japanese Patent Application No. JPA2001-244127, Aug. 12, 2016, 13 pages.
Partial English Translation and Abstract of Japanese Patent Application No. JPA2008-84964, Aug. 12, 2016, 20 pages.
Partial English Translation and Abstract of Japanese Patent Application No. JPA2009-218432, Aug. 12, 2016, 25 pages.
Foreign Communication From a Counterpart Application, European Application No. 14868704.9, Extended European Search Report dated Feb. 12, 2016, 9 pages.
Partial English Translation and Abstract of Chinese Patent Application No. CN101052286, Jun. 11, 2015, 4 pages.
Foreign Communication From a Counterpart Application, PCT Application No. PCT/CN2014/073401, International Search Report dated Oct. 28, 2014, 10 pages.
Foreign Communication From a Counterpart Application, PCT Application No. PCT/CN2014/073401, Written Opinion dated Oct. 28, 2014, 5 pages.
Foreign Communication From A Counterpart Application, Chinese Application No. 201480003096.5, Chinese Office Action dated May 3, 2017, 10 pages.

* cited by examiner

ELECTRONIC DEVICE AND SHIELDING MEMBER PRODUCTION METHOD

CROSS-REFERENCE TO RELATED APPLICATIONS

This application is a continuation of International Application No. PCT/CN2014/073401, filed on Mar. 13, 2014, which is hereby incorporated by reference in its entirety.

TECHNICAL FIELD

The present invention relates to the field of electronic technologies, and in particular, to an electronic device and a shielding member production method.

BACKGROUND

With development of science and technology and progress of society, electronic devices such as mobile phones, computers, and televisions have already become an indispensable part in people's life and work. An electronic device generally includes a circuit board on which an electronic component is disposed and a diecasting metal member on which a hole or slot is disposed, where the diecasting metal member is also used as shielding space of the electronic component. A purpose of disposing the hole or slot is to reduce a weight of the diecasting metal member, or the hole or slot needs to be disposed because of a spatial constraint of a product structure and because of a component layout (for example: a component is high, and in order not to increase an overall thickness, a hole or slot needs to be disposed on some part of the diecasting metal member). The diecasting metal member may be made into different complex shapes and structures according to a need.

The hole or slot is disposed on the metal member, and an electromagnetic wave of the electronic component can pass through the hole or slot, affecting operation of an electronic component on the other side of the diecasting metal member. In the prior art, if a hole is disposed, generally an electromagnetic wave generated by the electronic component is prevented, in a manner of sticking an electrically conductive film, from passing through the hole or slot.

However, because a thickness of the diecasting metal member itself is relatively large, sticking the electrically conductive film on the hole or slot of the diecasting metal member further increases a thickness of the electronic device.

SUMMARY

Embodiments of the present invention provide an electronic device and a shielding member production method, resolving a technical problem in the prior art that, because a thickness of a diecasting metal member itself is relatively large, sticking an electrically conductive film on a hole or slot of the diecasting metal member increases a thickness of an electronic device.

A first aspect of an embodiment of the present invention provides an electronic device, where the electronic device includes a metal member, a circuit board, and a shielding member, where a through hole or slot is disposed on the metal member, and the metal member is a stamped metal member or a forged metal member; an electronic component is disposed on the circuit board; the shielding member includes a blocking portion and an enclosing portion, the blocking portion is made of an electrically conductive plastic material, and the enclosing portion is made of a metal material or an electrically conductive plastic material; the blocking portion is configured to block the through hole or slot, the enclosing portion is disposed around the electronic component, one end of the enclosing portion is electrically connected to the metal member, and the other end of the enclosing portion is electrically connected to ground copper of the circuit board; the metal member, the blocking portion, the enclosing portion, and the circuit board form shielding space, and the electronic component is located in the shielding space.

In a first possible implementation manner of the first aspect, the electronic device further includes a reinforcing portion that is configured to enhance strength of the metal member and is fastened on the metal member.

With reference to the first possible implementation manner of the first aspect, in a second possible implementation manner of the first aspect, the reinforcing portion is disposed opposite to the electronic component.

With reference to the first aspect and the first or the second possible implementation manner of the first aspect, in a third possible implementation manner of the first aspect, the shielding member further includes a buckling portion connected to the blocking portion, and the buckling portion is buckled in the through hole or slot.

With reference to the third possible implementation manner of the first aspect, in a fourth possible implementation manner of the first aspect, the shielding member further includes a fastening portion connected to the buckling portion, and a size of the fastening portion is greater than a size of the through hole or slot.

With reference to the first aspect and the first to the fourth possible implementation manners of the first aspect, in a fifth possible implementation manner of the first aspect, an electrically conductive elastic member is disposed between the enclosing portion and the circuit board or between the enclosing portion and the metal member.

With reference to the first aspect and the first to the fifth possible implementation manners of the first aspect, in a sixth possible implementation manner of the first aspect, the through hole or slot is disposed opposite to the electronic component.

With reference to the first aspect and the first to the sixth possible implementation manners of the first aspect, in a seventh possible implementation manner of the first aspect, the electrically conductive plastic material is specifically electrically and thermally conductive plastic.

With reference to the first aspect and the first to the seventh possible implementation manners of the first aspect, in an eighth possible implementation manner of the first aspect, an insulation layer is disposed on a surface, away from the metal member, of the blocking portion.

With reference to the first aspect to the eighth possible implementation manner, in a ninth possible implementation manner of the first aspect, the blocking portion and the enclosing portion are integrally injection molded, or the blocking portion, the enclosing portion, and the metal member are integrally metal injection molded.

A second aspect of the embodiments of the present invention provides a shielding member production method, where the method includes disposing a through hole or slot on a metal member, where the metal member is a stamped metal member or a forged metal member; forming a blocking portion on the metal member in an injection molding manner using an electrically conductive plastic material, where the blocking portion is configured to block the through hole or slot; and forming an enclosing portion using a metal material or an electrically conductive plastic material, where the enclosing portion is configured to be disposed around an electronic component on a circuit board, one end of the enclosing portion is electrically connected to the metal member, and the other end of the enclosing portion is electrically connected to ground copper of the circuit board, so that the electronic component is in enclosed shielding space.

In a first possible implementation manner of the second aspect, the method further includes forming, in the through hole or slot in an injection molding manner using a plastic material, a buckling portion and a fastening portion connected to the buckling portion, where a size of the fastening portion is greater than a size of the through hole or slot.

With reference to the first possible implementation manner of the second aspect, in a second possible implementation manner of the second aspect, when the enclosing portion is made of the electrically conductive plastic material, the enclosing portion, the blocking portion, the buckling portion, and the fastening portion are formed on the metal member by means of one-off injection molding.

Beneficial effects of the embodiments of the present invention are as follows.

According to the foregoing electronic device, the blocking portion configured to block the through hole or slot on the metal member and the enclosing portion disposed around the electronic component are disposed, where one end of the enclosing portion is electrically connected to the metal member, and the other end of the enclosing portion is electrically connected to the ground copper of the circuit board. The ground copper is disposed on the circuit board, and the enclosing portion is made of an electrically conductive material, and therefore, enclosed space in which the electronic component is disposed is formed by the metal member, the circuit board, the blocking portion, and the enclosing portion, and an electromagnetic wave generated on the metal member is transferred to the ground copper of the circuit board by the enclosing portion, to be conducted away, so that shielding space enclosing the electronic component is formed, so as to reduce or prevent outward radiation of an electromagnetic wave generated by the electronic component, thereby preventing operation of another electronic component from being affected.

In the foregoing electronic device, the metal member is a stamped metal member or a forged metal member, a thickness of the stamped metal member or a thickness of the forged metal member is less than a thickness of the diecasting metal member, and therefore, even after the shielding member is formed on the metal member, a sum of a thickness of the metal member and a thickness of the shielding member is also less than a sum of the thickness of the diecasting metal member and a thickness of an electrically conductive film. Therefore, the foregoing electronic device resolves a technical problem in the prior art that, because the thickness of the diecasting metal member itself is relatively large, sticking the electrically conductive film on the hole or slot of the diecasting metal member increases a thickness of the electronic device.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention.

DESCRIPTION OF EMBODIMENTS

To enable a person in the art to better understand the solutions of the present invention, the following clearly describes the technical solutions in the embodiments of the present invention with reference to the accompanying drawings in the embodiments of the present invention. Apparently, the described embodiments are merely a part rather than all of the embodiments of the present invention.

Embodiment 1

Figure 1:
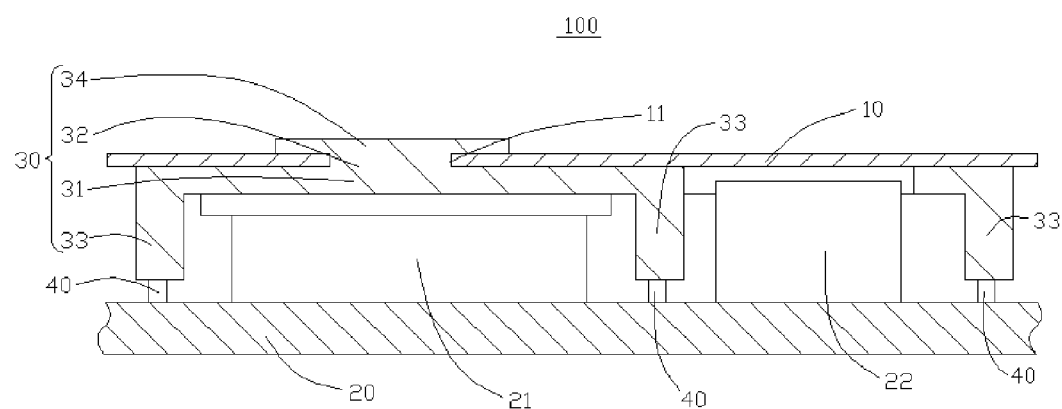
FIG. 1 is a schematic structural diagram of an electronic device according to a first exemplary implementation manner of the present invention.

As shown in FIG. 1, FIG. 1 is a schematic structural diagram of an electronic device 100 according to an implementation manner of the present invention. The electronic device 100 may be a device such as a mobile phone, a tablet computer (e.g. an iPAD), a computer, a television, or a server. The electronic device 100 includes a metal member 10, a circuit board 20, and a shielding member 30.

Figure 2:
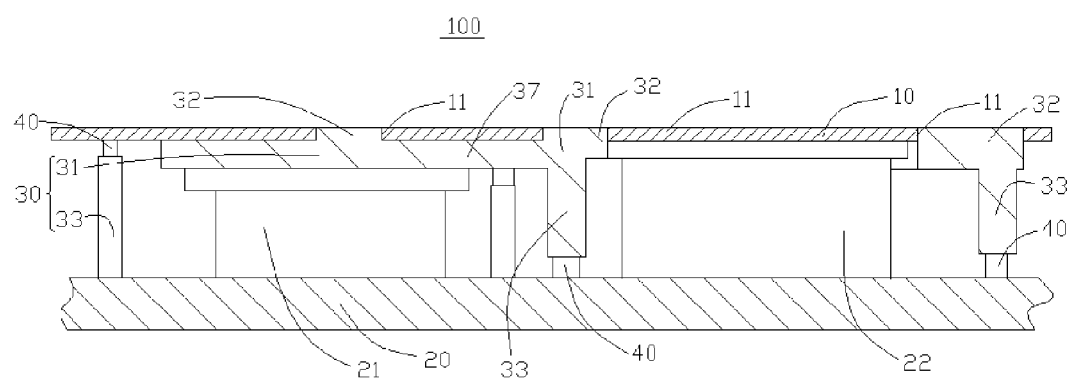
FIG. 2 is a schematic structural diagram of an electronic device according to a second exemplary implementation manner of the present invention.
Figure 3:
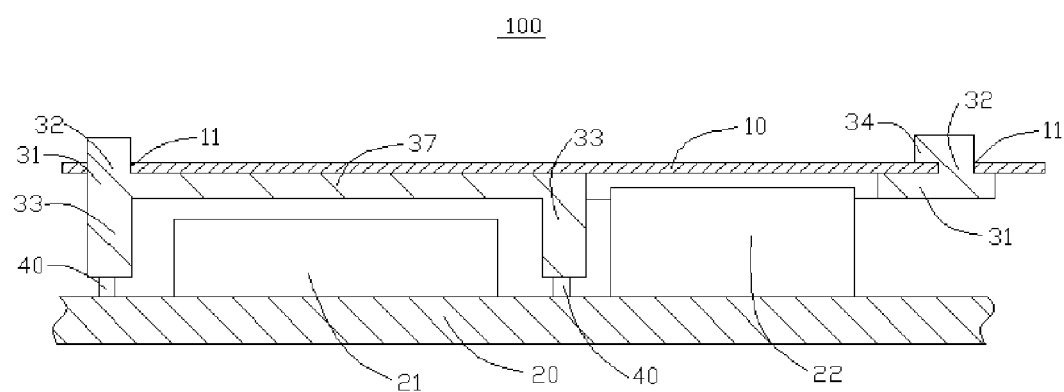
FIG. 3 is a schematic structural diagram of an electronic device according to a third exemplary implementation manner of the present invention.
Figure 4:
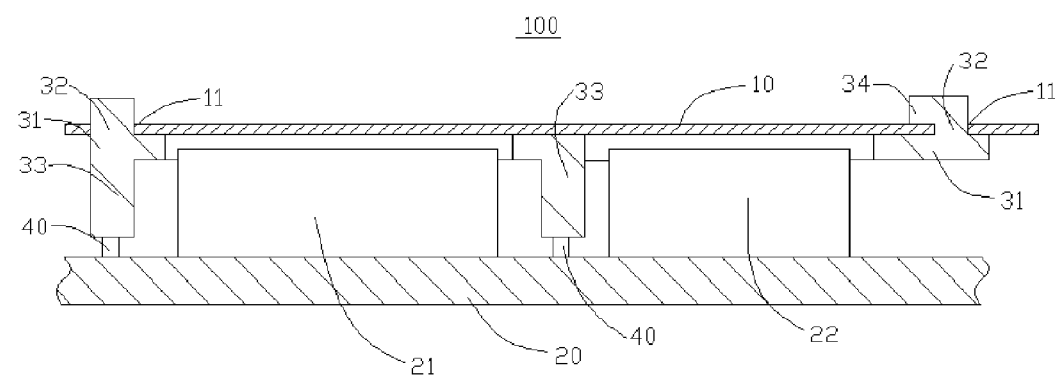
FIG. 4 is a schematic structural diagram of an electronic device according to a fourth exemplary implementation manner of the present invention.
Figure 5:
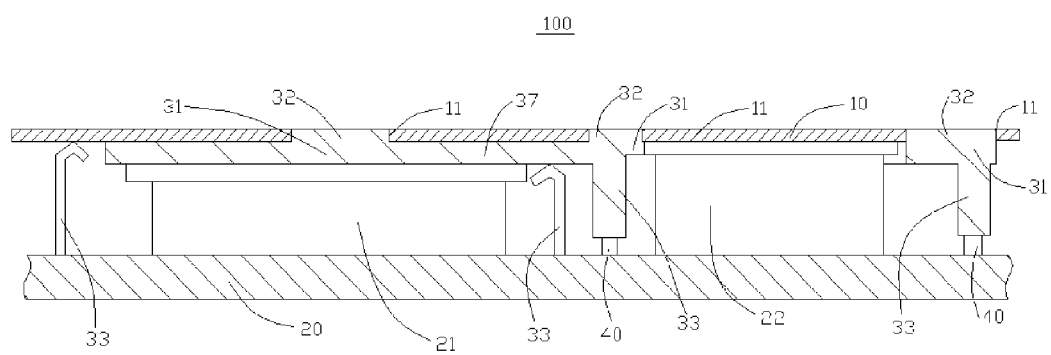
FIG. 5 is a schematic structural diagram of an electronic device according to a fifth exemplary implementation manner of the present invention.
Figure 6:
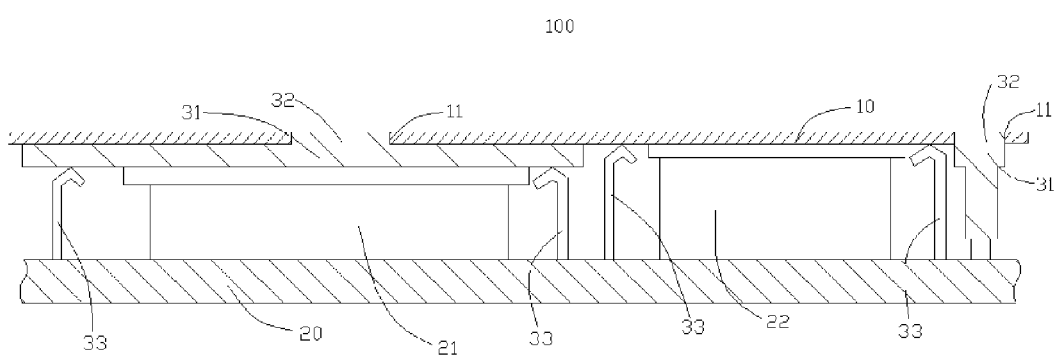
FIG. 6 is a schematic structural diagram of an electronic device according to a sixth exemplary implementation manner of the present invention.

A through hole or slot 11 is disposed on the metal member 10, a shape and a size of the hole or slot 11 may be set according to a need. A function of disposing the through hole or slot 11 is mainly to reduce a weight of metal of the electronic device 100, or is for stress relief, or is to make way for an electronic component in the electronic device 100, or is to fasten an element that needs to be fastened on the metal member 10. Therefore, according to a need, a quantity of through holes or slots 11 may be one, or may be multiple. As shown in FIG. 1, the quantity of through holes or slots 11 is one, and disposing the through hole or slot 11 is to reduce a weight of the electronic device 100. If a size of the through hole or slot 11 is greater than a size of the electronic component 21, a purpose of disposing the through hole or slot 11 may be to make way for the electronic component. As shown in FIG. 2 and FIG. 5, the quantity of through holes or slots 11 is three, where some of the through holes or slots 11 are for reducing the weight of the electronic device 100, and a purpose of disposing other two through holes or slots 11 is to fasten the element that needs to be fastened on the metal member 10. In this implementation manner, the element may be the shielding member 30. As shown in FIG. 3, FIG. 4, and FIG. 6, the quantity of through holes or slots 11 is two, and a purpose of disposing the two through holes or slots 11 is to fasten the element that needs to be fastened on the metal member 10. In this implementation manner, the element may be the shielding member 30.

The metal member 10 may be a stamped metal member or a forged metal member. The stamped metal member has a fine heat-conducting feature (a thermal conductivity coefficient may be greater than 250 watt/meter-kelvin (W/m-K)), a low manufacturing cost, and a small wall thickness (in a case in which there is no strength requirement, the wall thickness may be ~0.1 millimeter (mm)). In addition, weldability of the stamped metal member is better than that of a diecasting metal member, but a complex shielding cavity cannot be made in the stamped metal member and local thickening cannot be performed on the stamped metal member, and only a mechanical part with a simple structure requirement and a uniform wall thickness can be made (local thinning may be performed by means of an etching process, but in consideration of a process and a cost, a thickness difference is generally within 0.2 mm). A heat-conducting feature of the diecasting metal member is worse than that of a stamped member, but a complex shielding cavity can be made and local thickening can be performed, resulting in high structural strength of the diecasting metal member. In addition, after diecasting or powder metallurgy, a computer numerical control machine (CNC) and the like needs to perform machining processing on the diecast metal member, and therefore, a manufacturing cost is high. Further, a wall thickness of the diecasting metal member is greater than that of the stamped metal member (the wall thickness: mostly ≥0.4 mm, and locally ≥0.3 mm), and welding the diecasting metal member is difficult. However, performance of the forged metal member is between that of the diecasting metal member and that of the stamped metal member.

An electronic component is disposed on the circuit board 20, and referring to FIG. 1, the circuit board 20 may include an electronic component 21 and an electronic component 22. A height of the electronic component 22 is greater than a height of the electronic component 21. The electronic component 21 and the electronic component 22 may be disposed opposite to the through hole or slot 11, or may not be disposed opposite to the through hole or slot 11. As shown in FIG. 1, the electronic component 21 is disposed opposite to one through hole or slot 11, but the electronic component 22 is not disposed opposite to the through hole or slot 11. In FIG. 3 and FIG. 4, neither the electronic component 21 nor the electronic component 22 is disposed opposite to the through hole or slot 11. The size of the hole or slot 11 may be set according to a need, that is, the size of the electronic component 21 may be greater than the size of the hole or slot 11, or may be smaller than the size of the hole or slot 11. For example, when a thickness of the electronic component 21 compared with that of the circuit board 20 is relatively large, the size of the hole or slot 11 may be greater than that of the electronic component 21, and a part of the electronic component 21 is disposed in the hole or slot 11, so as to reduce a distance between the metal member 10 and the circuit board 20, thereby reducing an overall thickness of the electronic device 100.

The shielding member 30 is fastened on the metal member 10, and is configured to shield an electromagnetic wave generated by the electronic component 21. The shielding member 30 includes a blocking portion 31 and an enclosing portion 33. The shielding member 30 may be formed by one portion, may be formed by connecting two separate portions such as the blocking portion 31 and the enclosing portion 33, or may be formed using a connecting portion to connect the blocking portion 31 and the enclosing portion 33; or the blocking portion 31 and the enclosing portion 33 may be two independent and separated portions.

The blocking portion 31 is made of an electrically conductive plastic material, the enclosing portion 33 is made of a metal material or an electrically conductive plastic material, the blocking portion 31 and the enclosing portion 33 may be integrally injection molded, or the blocking portion 31, the enclosing portion 33, and the metal member 10 may be integrally metal injection molded.

Specifically, the blocking portion 31 may be made of the electrically conductive plastic material, the blocking portion 31 is configured to block the through hole or slot 11, to reduce or prevent passing, by the electromagnetic wave generated by the electronic component 21, through the through hole or slot 11. A quantity of blocking portions 31 is determined according to the quantity of through holes or slots 11, and when the quantity of blocking portions 31 is two or more than two, whether the blocking portions 31 are connected may be set according to a need. As shown in FIG. 1, the quantity of through holes or slots 11 is one, and therefore, the quantity of blocking portions 31 may be one; in FIG. 2 and FIG. 5, the quantity of through holes or slots 11 is three, and therefore, the quantity of blocking portions 31 is three, where one of the three blocking portions 31 is separate and is not connected to the other two blocking portions 31, and because strength of a metal member 10 between the other two blocking portions 31 needs to be enhanced or space is sufficient, a connecting portion or a reinforcing portion 37 configured to connect the two blocking portions 31 is disposed between the other two blocking portions 31. One or more reinforcing portions 37 may be disposed according to a need, the reinforcing portion 37 may be independent, or may be integrally formed with the blocking portion 31. In addition, a thickness of each part of each reinforcing portion 37 may be different. In this implementation manner, a material of the reinforcing portion 37 is the same as a material of the blocking portion 31, and in another implementation manner, the reinforcing portion 37 may be made of a plastic insulation material.

As shown in FIG. 3, the quantity of through holes or slots 11 is two, and therefore, the quantity of blocking portions 31 is two, and the two blocking portions 31 are independent, that is, the two blocking portions 31 are not connected to each other, or the two blocking portions 31 may be connected as a whole in another part according to a structural design requirement. Strength of a part that is of the metal member 10 and opposite to the electronic component 21 needs to be enhanced, and therefore, a reinforcing portion 37 connected to one of the two blocking portions 31 is disposed on a surface that is of the metal member 10 and opposite to the electronic component 21. In this implementation manner, the reinforcing portion 37 is connected to one blocking portion 31, and in another implementation manner, the reinforcing portion 37 may be independent and may not be connected to the blocking portion 31 or the enclosing portion 33. As shown in FIG. 4 and FIG. 6, the quantity of through holes or slots 11 is two, and therefore, the quantity of blocking portions 31 is two, and the two blocking portions 31 are independent, that is, the two blocking portions 31 are not connected to each other, a connection part may be disposed, according to a structural design requirement, on a location allowed by a product thickness, such as an edge, and a location where a relatively short component is.

When there is sufficient space in the electronic device 100, the blocking portion 31, after being injection molded, may be fastened on the metal member 10 in a bonding manner or in a screw locking manner. When there is limited space in the electronic device 100, the blocking portion 31 may be directly injection molded on the metal member 10, in this way, a thickness of the blocking portion 31 may be made relatively small, so as to reduce the thickness of the electronic device 100. In addition, to further increase a binding force between the blocking portion 31 and the metal member 10, the blocking portion 31 may be formed on the metal member 10 in a metal injection molding manner.

The electrically conductive plastic material may be specifically electrically and thermally conductive plastic, which has a desirable heat-conducting property, and therefore, when the blocking portion 31 is an electrically conductive plastic material, the blocking portion 31 may be in direct contact with the electronic component 21. To further improve heat conduction efficiency between the blocking portion 31 and the electronic component 21, a thermal interface material such as a thermally conductive pad may be added between the electronic component 21 and the blocking portion 31, thereby achieving a smaller heat transfer thermal resistance, and increasing the heat conduction efficiency between the blocking portion 31 and the electronic component 21. In addition, an insulation layer is set on a surface, away from the metal member 10, of the blocking portion 31. By setting the insulation layer, after the blocking portion 31 is deformed, the electromagnetic wave generated by the electronic component 21 can still be shielded.

When the hole or slot 11 on the metal member 10 is larger than the electronic component 21, a part of the electronic component 21 is disposed in the hole or slot 11, and in this case, a structure (for example, this structure may be an insulation layer) covering the electronic component 21 may be formed on the metal member 10 in an injection molding manner and the like, to prevent the electromagnetic wave generated by the electronic component 21 from passing through the hole or slot 11 on the metal member 10.

The enclosing portion 33 is made of a metal material or an electrically conductive plastic material, the enclosing portion 33 is disposed around the electronic component 21, one end of the enclosing portion 33 is in contact with the metal member 10 through an electrically conductive elastic member 40, and the other end of the enclosing portion 33 is in contact with the circuit board 20. Specifically, the other end of the enclosing portion 33 is electrically connected to ground copper of the circuit board 20. The ground copper is disposed on the circuit board 20 and the enclosing portion 33 is made of an electrically conductive material, and therefore, a charge generated on the metal member 10 may be transferred to the ground copper of the circuit board 20 using the enclosing portion 33, to be conducted away, thereby reducing or preventing radiation and interference caused by the electromagnetic wave generated by the electronic component 21 to surroundings. In this implementation manner, the enclosing portion 33 comes into contact with the metal member 10 using the electrically conductive elastic member 40, and in another implementation manner, the enclosing portion 33 may be in direct contact with the metal member 10.

In addition, a quantity of enclosing portions 33 may be set according to a quantity of electronic components. As shown in FIG. 1, FIG. 2, FIG. 5, and FIG. 6, both the electronic component 21 and the electronic component 22 need to be shielded, and therefore, two shielding cavities are formed, where one shields the electronic component 21, and the other shields the electronic component 22.

As shown in FIG. 5, when the enclosing portion 33 disposed around the electronic component 21 is made of a metal material, the enclosing portion 33 disposed around the electronic component 22 is made of an electrically conductive plastic material, and the enclosing portion 33 is a separate element; when the enclosing portion 33 is made of the metal material, the enclosing portion 33 may be fastened on the circuit board 20 by means of welding; when the enclosing portion 33 is made of an electrically conductive material, the enclosing portion 33 may be fastened on the circuit board 20 using a fastening member such as a screw. As shown in FIG. 6, both the enclosing portion 33 disposed around the electronic component 21 and the enclosing portion 33 disposed around the electronic component 22 are made of the metal material. As shown in FIG. 1 to FIG. 4, when the enclosing portion 33 is made of the electrically conductive plastic material, the enclosing portion 33 may be a separate element, or may be integrally formed with the blocking portion 31 and formed on the metal member 10 in an injection molding manner.

In addition, to reduce an exposed copper area on the circuit board 20 to leave more layout space for a component on the circuit board 20, the enclosing portion 33 may be set as a separate metal member, and as shown in FIG. 5, the enclosing portion 33 disposed around the electronic component 21 is a separate metal member. As shown in FIG. 6, the enclosing portion 33 disposed around the electronic component 21 and the enclosing portion 33 disposed around the electronic component 22 are both separate metal members.

Using the metal member 10, the circuit board 20, the blocking portion 31, and the enclosing portion 33, the electronic component 21 is in shielding space, so as to prevent the electromagnetic wave generated by the electronic component 21 from affecting another electronic component. When the electronic component 21 works, the electromagnetic wave generated by the electronic component 21 can be shielded by the blocking portion 31, the enclosing portion 33, and the metal member 10, so as to reduce or prevent outward radiation of the electromagnetic wave generated by the electronic component 21, thereby preventing operation of the another electronic component from being affected. Alternatively, the metal member 10, the enclosing portion 33, and the circuit board form shielding space, so that the electronic component 22 is in the shielding space, as shown in FIG. 1.

In addition, to improve heat conduction efficiency, a thermally conductive material with a thermal conductivity coefficient k greater than 1 W/m-K may be selected and used as the electrically conductive plastic material.

According to the foregoing electronic device 100, the blocking portion 31 configured to block the through hole or slot 11 on the metal member 10 and the enclosing portion 33 disposed around the electronic component 21 are disposed, where one end of the enclosing portion 33 is electrically connected to the metal member 10, and the other end of the enclosing portion 33 is electrically connected to the circuit board 20. The ground copper is disposed on the circuit board 20, and the enclosing portion 33 is made of an electrically conductive material, and therefore, enclosed space in which the electronic component 21 is located is formed among the metal member 10, the circuit board 20, the blocking portion 31, and the enclosing portion 33, and an electromagnetic wave generated on the metal member 10 is transferred to the ground copper of the circuit board 20 by the enclosing portion 33, to be conducted away, so that shielding space enclosing the electronic component 21 is formed, so as to reduce or prevent outward radiation of the electromagnetic wave generated by the electronic component 21, thereby preventing operation of another electronic component from being affected.

In the foregoing electronic device 100, the metal member 10 may be a stamped metal member or a forged metal member, a thickness of the stamped metal member or a thickness of the forged metal member is less than a thickness of the diecasting metal member, and therefore, even after the shielding member 30 is formed on the metal member 10, a sum of a thickness of the metal member 10 and a thickness of the shielding member 30 is also less than a sum of the thickness of the diecasting metal member and a thickness of an electrically conductive film. Therefore, the foregoing electronic device 100 resolves a technical problem in the prior art that, because the thickness of the diecasting metal member itself is relatively large, sticking the electrically conductive film on the hole or slot of the diecasting metal member further increases a thickness of the electronic device.

In addition, combination of the stamped metal member or the forged metal member and the electrically conducive plastic member, compared with original combination of the forged metal member and common plastic, not only enhances mechanical reliability of the metal member and the plastic member, and a cost of using an electrically and thermally conductive plastic member, compared with a cost of using common insulation plastic that is thermally conductive, is also reduced.

In a specific implementation manner, by means of a precision injection molding property and a complex molding property that are of plastic, an electrically conductive shielding cavity or isolation cavity may be made, that is, the blocking portion 31 and the enclosing portion 33 may be formed on the metal member 10 in a one-off manner. A thickness of each part of the shielding member 30 may be different from a thickness of the metal member 10, and when strength of a part of the metal member 10 needs to be enhanced, electrically conductive plastic needs to be injection molded on this part of the metal member 10, and a thickness of the electrically conductive plastic may be set according to a need; when space in a thickness direction of the electronic device 100 is limited, plastic may not be injection molded on a part whose thickness is limited and that is of the metal member 10, so that an overall thickness of a product is not increased.

In a specific implementation manner, referring to FIG. 1, when the blocking portion 31 is located between the electronic component 21 and the metal member 10, to increase a structural binding force between the blocking portion 31 and the metal member 10, the shielding member 30 may further include a buckling portion 32 connected to the blocking portion 31, and the buckling portion 32 is buckled in the through hole or slot 11, thereby increasing the structural binding force between the blocking portion 31 and the metal member 10, increasing stability of the blocking portion 31, and reducing a possibility that the blocking portion 31 is separated from the metal member 10. The blocking portion 31 and the buckling portion 32 may be integrally formed, and certainly, may also be two elements, where the blocking portion 31 and the buckling portion 32 are combined in a bonding manner.

Further, to increase a structural binding force between the blocking portion 31 and the metal member 10 and a structural binding force between the buckling portion 32 and the metal member 10, the shielding member 30 further includes a fastening portion 34 connected to the buckling portion 32, where the fastening portion 34 and the blocking portion 31 are separately disposed on two opposite sides of the metal member 10, and a size of the fastening portion 34 is greater than the size of the through hole or slot 11. The blocking portion 31, the buckling portion 32, and the fastening portion 34 may be integrally formed, and certainly, the blocking portion 31, the buckling portion 32, and the fastening portion 34 may also be combined in a bonding manner. The fastening portion 34 whose size is greater than that of the through hole or slot 11 on another side of the metal member 10, thereby preventing the shielding member 30 from departing from the metal member 10, and increasing stability of the shielding member 30.

In addition, to increase stability of electrical contact between the enclosing portion 33 and the circuit board 20, specifically, the electrically conductive elastic member 40 is disposed between the enclosing portion 33 and the circuit board 20. The electrically conductive elastic member 40 may be an electrically conductive elastomer or electrically conductive foam. The enclosing portion 33 may not be in direct contact with the ground copper of the circuit board 20, but may come into contact with the ground copper using the electrically conductive elastic member 40. The ground copper of the circuit board 20 may be a copper layer on a surface layer of the circuit board 20.

According to the foregoing electronic device 100, the blocking portion 31 configured to block the through hole or slot 11 on the metal member 10 and the enclosing portion 33 disposed around the electronic component 21 are disposed, where one end of the enclosing portion 33 is electrically connected to the metal member 10, and the other end of the enclosing portion 33 is electrically connected to the ground copper of the circuit board 20. The ground copper is disposed on the circuit board 20 and the enclosing portion 33 is made of an electrically conductive material, and therefore, enclosed space in which the electronic component 21 is located is formed among the metal member 10, the circuit board 20, the blocking portion 31, and the enclosing portion 33, and an electromagnetic wave generated on the metal member 10 is transferred to the ground copper of the circuit board 20 by the enclosing portion 33, to be conducted away, so that shielding space enclosing the electronic component 21 is formed, so as to reduce or prevent outward radiation of the electromagnetic wave generated by the electronic component 21, thereby preventing operation of another electronic component from being affected.

In the foregoing electronic device 100, the metal member 10 may be a stamped metal member or a forged metal member, a thickness of the stamped metal member or a thickness of the forged metal member is less than a thickness of the diecasting metal member, and therefore, even after the shielding member 30 is formed on the metal member 10, a sum of a thickness of the metal member 10 and a thickness of the shielding member 30 is also less than a sum of the thickness of the diecasting metal member and a thickness of an electrically conductive film. Therefore, the foregoing electronic device 100 resolves a technical problem in the prior art that, because the thickness of the diecasting metal member itself is relatively large, sticking the electrically conductive film on the hole or slot of the diecasting metal member further increases a thickness of the electronic device.

The buckling portion 32 connected to the blocking portion 31 is formed in the through hole or slot 11, thereby increasing the structural binding force between the blocking portion 31 and the metal member 10, increasing the stability of the blocking portion 31, and reducing the possibility that the blocking portion 31 is separated from the metal member 10.

The fastening portion 34 whose size is greater than that of the through hole or slot 11 is disposed on the other side of the metal member 10, thereby preventing the shielding member 30 from departing from the metal member 10, and increasing the stability of the shielding member 30.

Embodiment 2

Figure 7:
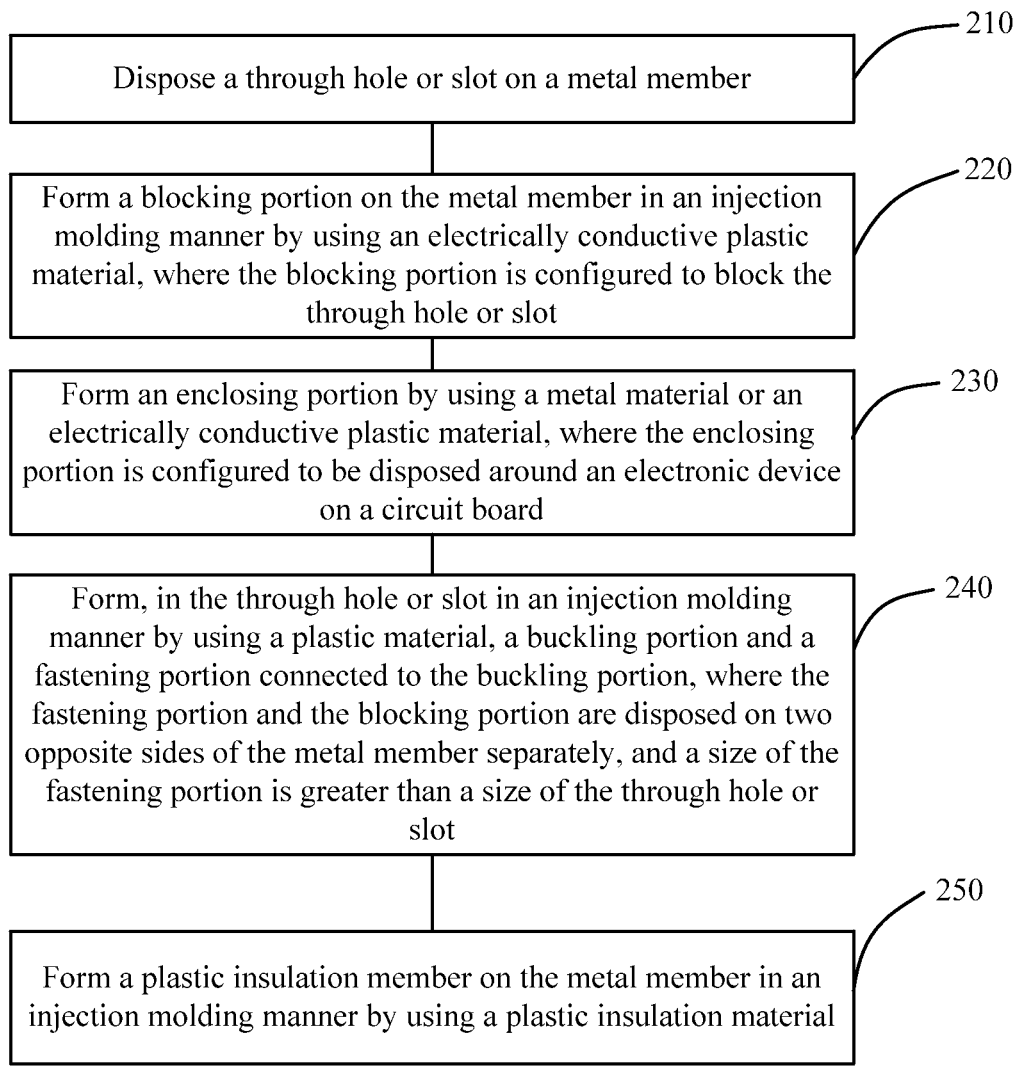
FIG. 7 is a flowchart of a shielding member production method according to another exemplary implementation manner of the present invention.

Based on a same inventive concept, this application further provides a shielding member production method, and as shown in FIG. 7, FIG. 7 is a flowchart of a shielding member production method according to an implementation manner of the present invention. Also with reference to FIG. 1, the shielding member production method includes the following steps.

Step 210: Dispose a through hole or slot 11 on a metal member 10, where the metal member 10 may be a stamped metal member or a forged metal member.

Step 220: Form a blocking portion 31 on the metal member 10 in an injection molding manner using an electrically conductive plastic material, where the blocking portion 31 is configured to block the through hole or slot 11.

Step 230: Form an enclosing portion 33 using a metal material or an electrically conductive plastic material, where the enclosing portion 33 is configured to be disposed around an electronic component 21 on a circuit board 20.

The method further includes: Step 240: Form, in the through hole or slot 11 in an injection molding manner using a plastic material, a buckling portion 32 and a fastening portion 34 connected to the buckling portion 32, where the fastening portion 34 and the blocking portion 31 are separately disposed on two opposite sides of the metal member 10, and a size of the fastening portion 34 is greater than a size of the through hole or slot 11.

Further, when the enclosing portion 33 is made of the electrically conductive plastic material, the enclosing portion 33, the blocking portion 31, the buckling portion 32, and the fastening portion 34 are formed on the metal member 10 by means of one-off injection molding.

The method further includes: Step 250: Form, on the metal member 10 in an injection molding manner using a plastic insulation material, a plastic insulation member used for antenna design.

According to the foregoing shielding member production method, the blocking portion 31 configured to block the through hole or slot 11 on the metal member 10 and the enclosing portion 33 disposed around the electronic component 21 are disposed, where one end of the enclosing portion 33 is in contact with the metal member 10, and the other end of the enclosing portion 33 is in contact with the circuit board 20. Ground copper is disposed on the circuit board 20 and the enclosing portion 33 is made of an electrically conductive material, and therefore, an electromagnetic wave generated on the metal member 10 is transferred to the ground copper of the circuit board 20 using the enclosing portion 33, to be conducted away, so that shielding space enclosing the electronic component 21 is formed, so as to reduce or prevent outward radiation of the electromagnetic wave generated by the electronic component 21, thereby preventing operation of another electronic component from being affected.

In the foregoing electronic device 100, a thickness of the stamped metal member or a thickness of the forged metal member is less than a thickness of the diecasting metal member, and therefore, even after the shielding member 30 is formed on the metal member 10, a sum of a thickness of the metal member 10 and a thickness of the shielding member 30 is also less than a sum of the thickness of the diecasting metal member and a thickness of an electrically conductive film. Therefore, the foregoing electronic device 100 resolves a technical problem in the prior art that, because the thickness of the diecasting metal member itself is relatively large, sticking the electrically conductive film on the hole or slot of the diecasting metal member further increases a thickness of the electronic device.

Although some exemplary embodiments of the present invention have been described, persons skilled in the art can make changes and modifications to these embodiments once they learn the basic inventive concept. Therefore, the following claims are intended to be construed as to cover the exemplary embodiments and all changes and modifications falling within the scope of the present invention.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. An electronic device, wherein the electronic device comprises:
    a metal member, wherein the metal member has at least one of a through hole and a slot, and wherein the metal member is one of a stamped metal member and a forged metal member;
    a circuit board, wherein an electronic component is disposed on the circuit board; and
    a shielding member, wherein the shielding member comprises a blocking portion, an enclosing portion, and a fastening portion disposed on the metal member, wherein the blocking portion is made of an electrically conductive plastic material, wherein the enclosing portion is made of one of a metal material and an electrically conductive plastic material, wherein the blocking portion blocks the at least one of the through hole and the slot, wherein the enclosing portion is disposed around the electronic component, wherein one end of the enclosing portion is electrically connected to the metal member, wherein the other end of the enclosing portion is electrically connected to a ground copper of the circuit board, wherein the electronic component is located in a shielding space formed by the metal member, the enclosing portion, the circuit board, and the blocking portion, wherein the shielding member further comprises a buckling portion connected to the blocking portion, wherein the buckling portion is buckled in the through hole or slot, and wherein a size of the fastening portion is greater than a size of the through hole or slot.

2. The electronic device according to claim 1, wherein the electronic device further comprises a reinforcing portion that enhances a strength of the metal member and is fastened on the metal member.

3. The electronic device according to claim 1, wherein an electrically conductive elastic member is disposed between the enclosing portion and the circuit board.

4. The electronic device according to claim 1, wherein an electrically conductive elastic member is disposed between the enclosing portion and the metal member.

5. The electronic device according to claim 1, wherein the through hole or slot is disposed opposite to the electronic component relative to the circuit board.

6. The electronic device according to claim 1, wherein the electrically conductive plastic material is electrically and thermally conductive plastic.

7. The electronic device according to claim 1, wherein an insulation layer is disposed on a surface, away from the metal member, of the blocking portion.

8. The electronic device according to claim 1, wherein the blocking portion and the enclosing portion are integrally injection molded.

9. The electronic device according to claim 1, wherein the blocking portion, the enclosing portion, and the metal member are integrally metal injection molded.

10. The electronic device according to claim 2, wherein the reinforcing portion is disposed opposite to the electronic component.

11. A shielding member production method, wherein the method comprises:
  disposing at least one of a through hole and a slot on a metal member, wherein the metal member is one of a stamped metal member and a forged metal member;
  forming a blocking portion on the metal member in an injection molding manner using an electrically conductive plastic material, wherein the blocking portion blocks the through hole or slot;
  forming an enclosing portion using one of a metal material and an electrically conductive plastic material, wherein the enclosing portion is disposed around an electronic component on a circuit board, wherein one end of the enclosing portion is electrically connected to the metal member, and wherein the other end of the enclosing portion is electrically connected to a ground copper of the circuit board such that the electronic component is in an enclosed shielding space; and
  forming, in the through hole or slot in an injection molding manner using a plastic material, a buckling portion and a fastening portion connected to the buckling portion, the fastening portion disposed on the metal member, wherein a size of the fastening portion is greater than a size of the through hole or slot, and wherein when the enclosing portion is made of the electrically conductive plastic material, the enclosing portion, the blocking portion, the buckling portion, and the fastening portion are formed on the metal member by means of one-off injection molding.

12. The electronic device according to claim 1, wherein the blocking portion and the through hole or slot are located above the electronic component such that the electronic component is between the blocking portion and the circuit board.

13. The electronic device according to claim 1, wherein the fastening portion is coupled to the blocking portion through the through hole or slot, wherein the fastening portion is on a first surface of the metal member that is opposite a second surface of the metal member, and wherein the blocking portion is in contact with the second surface.

* * * * *